United States Patent [19]
Cutter et al.

[11] Patent Number: 6,069,064
[45] Date of Patent: *May 30, 2000

[54] METHOD FOR FORMING A JUNCTIONLESS ANTIFUSE

[75] Inventors: Douglas J. Cutter, Fort Collins, Colo.; Fan Ho, Sunnyvale, Calif.; Kurt D. Beigel, Boise, Id.

[73] Assignee: Micron Technology, Inc., Boise, Id.

[ * ] Notice: This patent issued on a continued prosecution application filed under 37 CFR 1.53(d), and is subject to the twenty year patent term provisions of 35 U.S.C. 154(a)(2).

[21] Appl. No.: 08/702,951

[22] Filed: Aug. 26, 1996

[51] Int. Cl.[7] ................................................. H01L 29/00
[52] U.S. Cl. ............................................. 438/600; 438/131
[58] Field of Search ................................. 438/600, 467, 438/131

[56] References Cited

U.S. PATENT DOCUMENTS

| | | | |
|---|---|---|---|
| 5,324,681 | 6/1994 | Lowrey et al. | 437/52 |
| 5,449,947 | 9/1995 | Chen et al. | 257/530 |
| 5,485,031 | 1/1996 | Zhang et al. | 257/530 |
| 5,490,042 | 2/1996 | Perkins | 361/778 |
| 5,493,147 | 2/1996 | Holzworth et al. | 257/530 |
| 5,502,000 | 3/1996 | Look et al. | 437/60 |
| 5,508,220 | 4/1996 | Eltoukhy et al. | 437/60 |
| 5,510,629 | 4/1996 | Karpovich et al. | 257/50 |
| 5,510,646 | 4/1996 | Forouhi et al. | 257/530 |
| 5,514,900 | 5/1996 | Iranmanesh | 257/530 |
| 5,527,745 | 6/1996 | Dixit et al. . | |
| 5,641,985 | 6/1997 | Tamura et al. . | |
| 5,759,876 | 6/1998 | Singlevich et al. | 438/131 |

*Primary Examiner*—Jey Tsai
*Attorney, Agent, or Firm*—Schwegman, Lundberg, Woessner & Kluth, P.A.

[57] ABSTRACT

A method and apparatus for forming a junctionless antifuse semiconductor structure comprises forming an antifuse in non-active areas of a semiconductor wafer. In one embodiment, the antifuse is formed over a polysilicon layer, which is coupled to a field oxide layer. In a further embodiment, the polysilicon layer comprises a bottom conductor layer in the antifuse. In another embodiment, a refractory metal silicide layer is formed between the polysilicon layer and the antifuse. In yet a further embodiment, the refractory metal silicide layer comprises the bottom conductor layer in the antifuse.

13 Claims, 14 Drawing Sheets

METHOD FOR FORMING A JUNCTIONLESS ANTIFUSE

FIELD OF THE INVENTION

The present invention relates to methods and apparatus for forming semiconductor devices, and in particular, to forming an antifuse in an integrated circuit.

BACKGROUND OF THE INVENTION

Integrated circuits (ICs) contain antifuses to selectively connect electrical nodes on an IC. One type of antifuse, as shown in the prior art semiconductor cross section of FIG. 1, is typically formed in an integrated circuit (IC) over active device areas, defined by field oxide 106, and separated from other conductive layers by an insulating material 108. The structure of an antifuse is similar to that of a capacitor. Antifuses contain a programming layer 110, sandwiched between two conductor layers 112 and 114. The programming layer 110 typically comprises a dielectric material, amorphous silicon, and/or a barrier metal, which prevents unwanted diffusion of material between the conductor layers 112 and 114.

Antifuses have a very high resistance in the unblown state, essentially forming an open circuit. In the blown state, it is desirable for antifuses to have a low resistance. To program an antifuse, as shown in FIG. 1, a high voltage is applied across the conducting layers 112 and 114. The high voltage causes dielectric layer 110 to breakdown, which forms a conductive path through the antifuse.

An inherent problem associated with antifuses is that high resistance is desired in the unblown state and very low resistance is desired in the blown state. It is difficult to form an antifuse with a high resistance in the unblown state, and then obtain a consistently low resistance value once an antifuse is turned programmed or blown. FIG. 2 shows the various components of the overall antifuse resistance, when it is in the unblown state. Resistance from n(+) regions 120, as shown in FIG. 1, formed where connections 122 are made to the substrate 124, have an associated resistance, shown as 218 in FIG. 2. Resistance from an n(−) region 126, over which the antifuse is formed, is shown as 228 in FIG. 2. Other components of the antifuse resistance comprise resistance 230 from the bottom conductor layer 112, resistance 232 from the top conductor layer 114, contact resistance 234 from the contact 122 to the top conductor layer 114, and resistance 236 from a transistor, which activates current through the antifuse. Capacitance 238 from the programming layer 110 has an effect on the voltage required to program the layer 110. A higher capacitance 238 due to a thinner dielectric results in a lower voltage required to program the layer 100. Once an antifuse is programmed, the highly resistive capacitance element 238 is replaced by a programmed layer resistance value, which is added to an antifuse's total resistance in the blown state.

Due to the large number of components which contribute to antifuse resistance, as ICs are becoming more dense and devices are required to perform more functions at a faster rate, it is critical that resistance be decreased throughout the antifuse. Lower antifuse resistance enables device functions to be performed faster, both when programming an antifuse and when a programmed antifuse is a component in an IC. For example, antifuses are currently used in dynamic random access memory (DRAM) cell arrays to actively connect redundant memory cells in place of defective cells, typically on a row or column basis. If antifuses are used for row or column redundancy, they may lie in a speed path and affect the access time of the memory. Therefore, it is important that resistance be minimized in an antifuse, which is programmed to a blown state.

Furthermore, as ICs are becoming more dense, it is desirable to decrease the amount of silicon substrate consumed per device, to enable more devices to be formed on a wafer in three dimensions. There is also a need for an improved antifuse structure, which has a lower resistance value in the blown state. This is required to improve IC performance and enable devices to perform faster. It is further desired to form an antifuse structure, in which junction-to-junction leakage and low reverse bias junction breakdown voltages, which have been a problem in the past, are eliminated.

SUMMARY OF THE INVENTION

An antifuse structure is formed in an integrated circuit (IC) on a polysilicon layer, which is formed over field oxide, covering nonactive device areas of a substrate. By forming an antifuse over field oxide, the amount of silicon substrate consumed is decreased, enabling IC densities to be increased. Furthermore, reverse bias junction breakdown is eliminated at the antifuse because the antifuse is not formed over an n(−) region in a p(−) substrate, as in conventional antifuse structures. This enables the antifuse to be programmed at a faster rate because a wafer level programming pad can be raised above the typical breakdown voltage for faster programming and a tighter resistance distribution after programming. By replacing the n(−) region with a polysilicon layer, a lower resistance IC is formed.

In a further embodiment of the invention, a refractory metal silicide layer is formed over the polysilicon layer, prior to forming an antifuse thereon. The use of refractory metal silicide further decreases the IC resistance. Therefore, programmed antifuses do not inhibit device speed, due to excessive resistance through the antifuse.

In a further embodiment of the invention, the polysilicon or refractory metal silicide layer, over which an antifuse is formed, comprises a bottom conductor layer in an antifuse structure.

BRIEF DESCRIPTION OF THE DRAWINGS

FIG. 5c is a schematic circuit diagram of an unprogrammed antifuse shown in FIG. 6a.

DESCRIPTION OF THE EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention. The following detailed description is, therefore, not to be taken in a limiting sense, and the scope of the present invention is defined by the appended claims.

Numbering in the Figures is usually done with the hundreds and thousands digits corresponding to the figure number, with the exception that the same components may appear in multiple figures. Signals and connections may be referred to by the same number or label, and the actual meaning should be clear from the context of use.

Figure 3A:
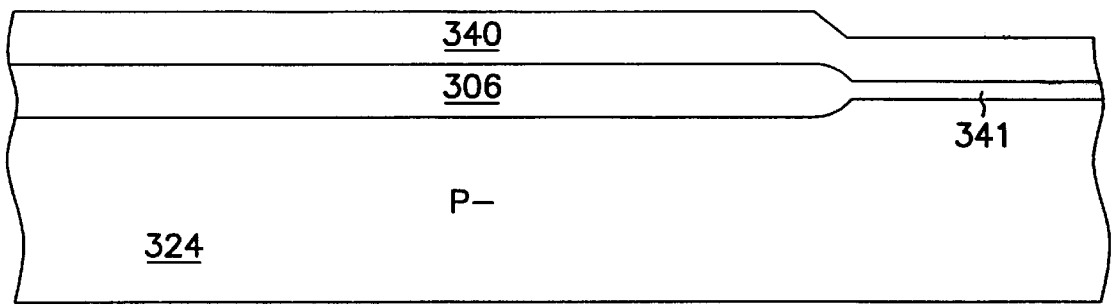
FIGS. 3a–3h are cross-sectional representations of an antifuse formed in accordance with the method of the invention, where an antifuse is formed over a conducting layer.

In one embodiment, to form an antifuse, a p(−) silicon substrate 324, a small portion of which is shown in FIG. 3a, is patterned with a layer of field oxide 306. Active device regions are defined on the substrate 324 by localized oxidation of silicon (LOCOS), as well known to one skilled in the art. In non-active areas of the substrate 324, as shown in FIG. 3a, a polysilicon layer 340 is deposited over the field oxide 306. The polysilicon layer 340 is doped to a positive conductivity (p-type) or a negative conductivity (n-type). This can be the same layer of polysilicon 340 as is used in forming transistor gates over gate oxide 341 in active areas of the substrate 324. Thus, the invention does not require any additional masks or films to manufacture the antifuse. However, the polysilicon layer 340 can be any conducting layer.

By forming the antifuse over non-active device regions, valuable semiconductor substrate 324 is conserved, allowing ICs to be manufactured with a high device density. Non-active device regions are meant to include oxidized regions 306, which overlay active device regions in the underlying substrate 324. Thus, device density is improved in a 3-dimensional sense.

Figure 3B:
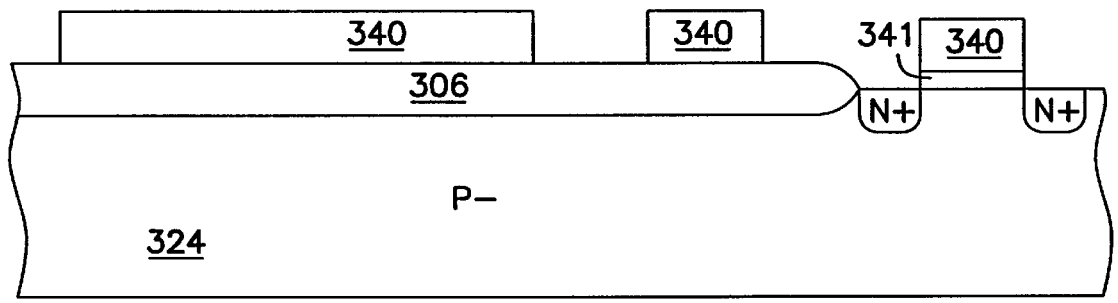
Figure 3C:
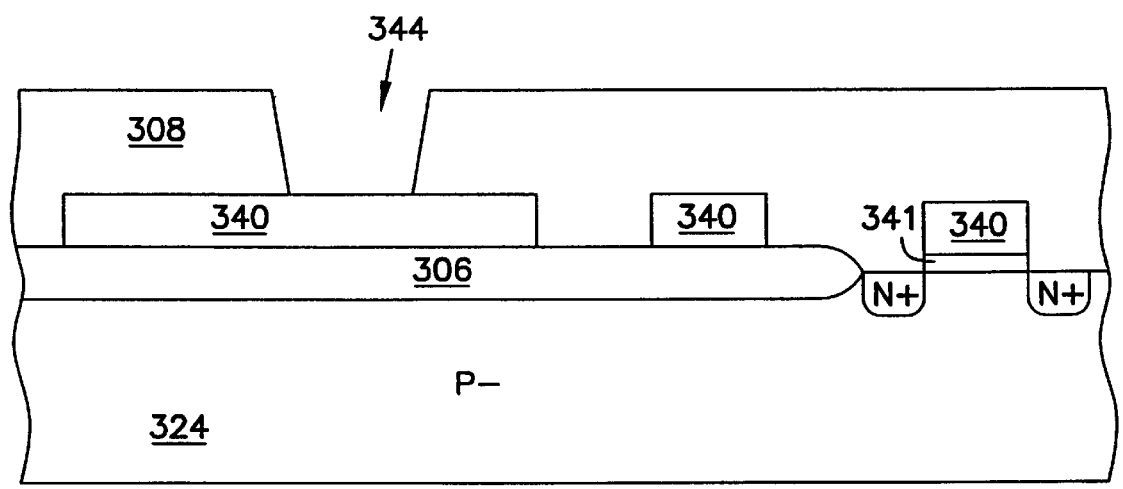
Figure 3D:
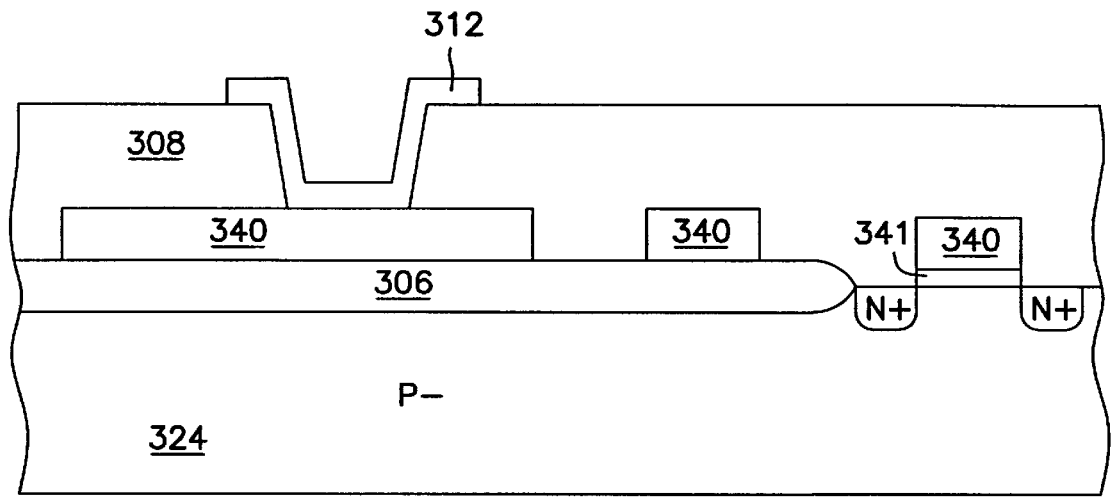

The polysilicon layer 340 is then photolithographically masked and etched down to the field oxide 306 to define islands, as shown in FIG. 3b, on which antifuses and contacts are formed. Next, an insulating material 308 is formed over the structure, and photolithographically masked and etched to define a recess 344 in which the antifuse is subsequently formed, as shown in FIG. 3c. A bottom conductor layer 312 is then formed on the structure, in the recess, as shown in FIG. 3d, defined by a photolithographic mask and etch. The bottom conductor layer 312 comprises polysilicon or a metal, as well known to one skilled in the art.

Figure 3E:
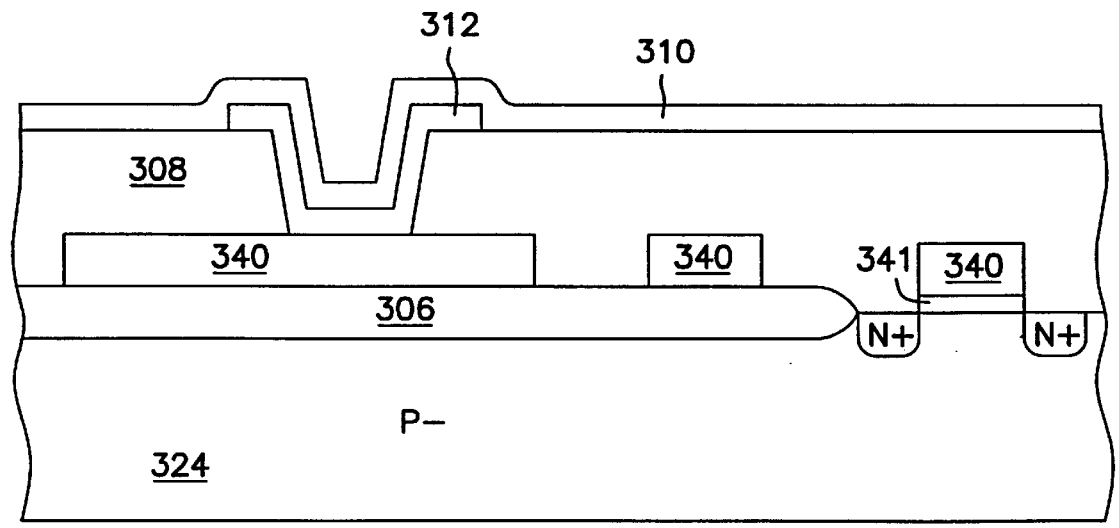

The next process step is forming a programming layer 310 over the bottom conductor layer 312, as shown in FIG. 3e. The programming layer 310 material is selected from the group comprising: amorphous silicon, polysilicon, silicon dioxide, silicon nitride, and tantalum dioxide, dielectrics, and other electrically-insulative programming layer 310 materials well known to one skilled in the art. Furthermore, the programming layer 310 can comprise a combination of layers, including a diffusion barrier layer or multiple dielectric layers.

Figure 3F:
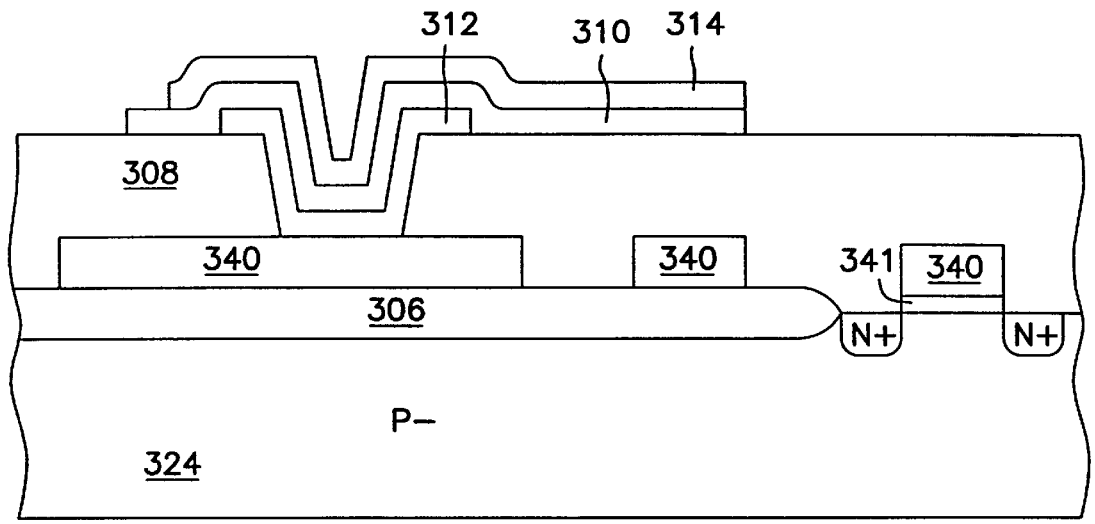

A top conductor layer 314 is then formed on the structure, as shown in FIG. 3f. The conductor layer 314 and the programming layer 310 are then defined by a photolithographic mask and etch, as shown in FIG. 3f. The top conductor layer 314 comprises polysilicon or metal, as well known to one skilled in the art.

Figure 1:
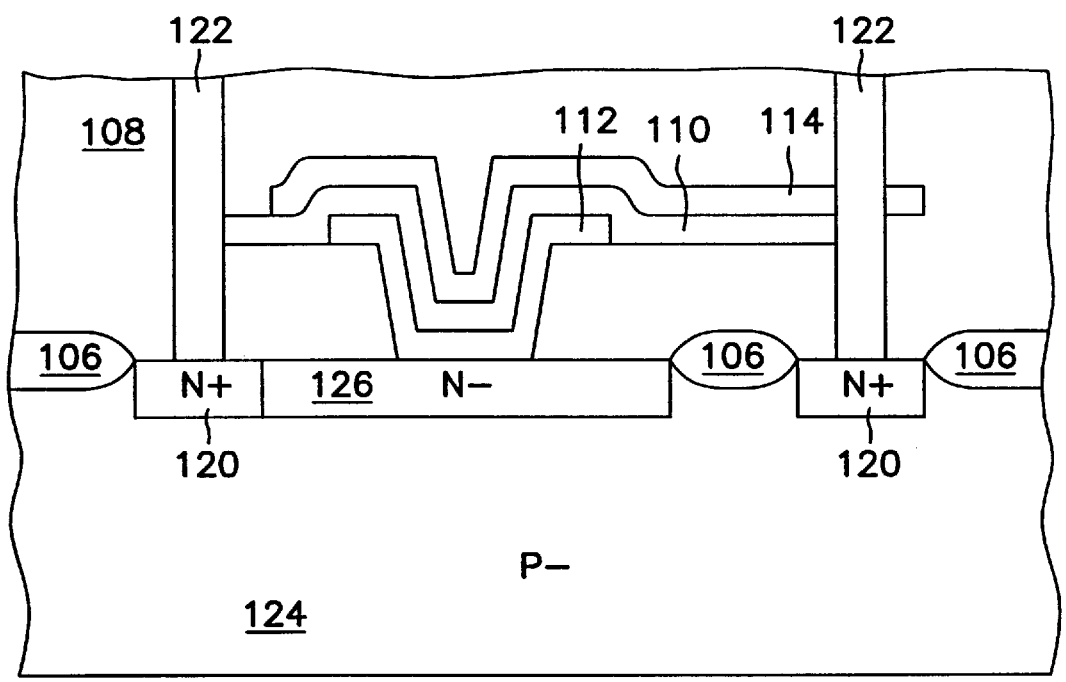
FIG. 1 is a prior art cross-sectional representation of an antifuse, formed in an integrated circuit.
Figure 3G:
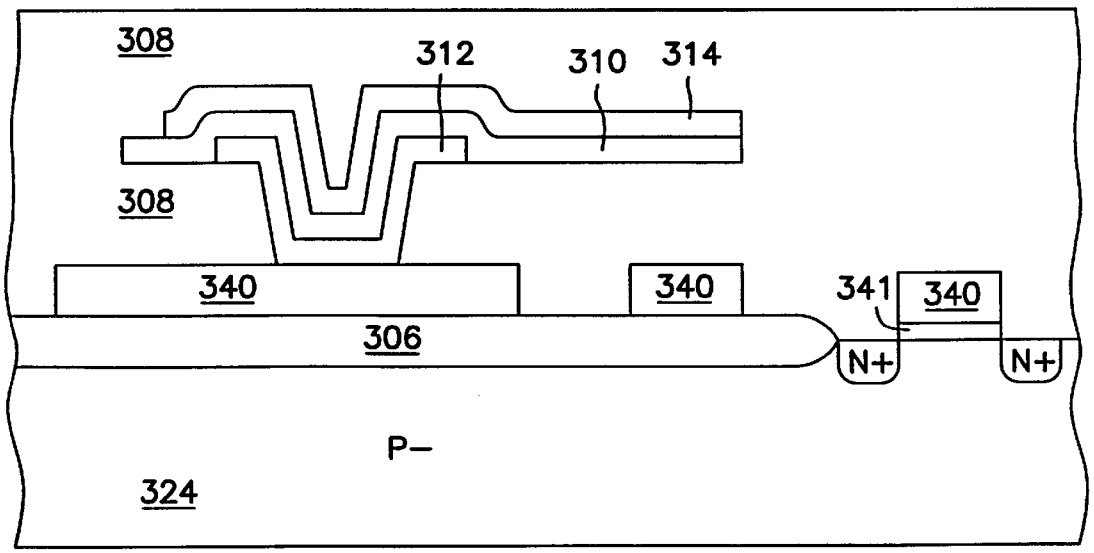
Figure 3H:
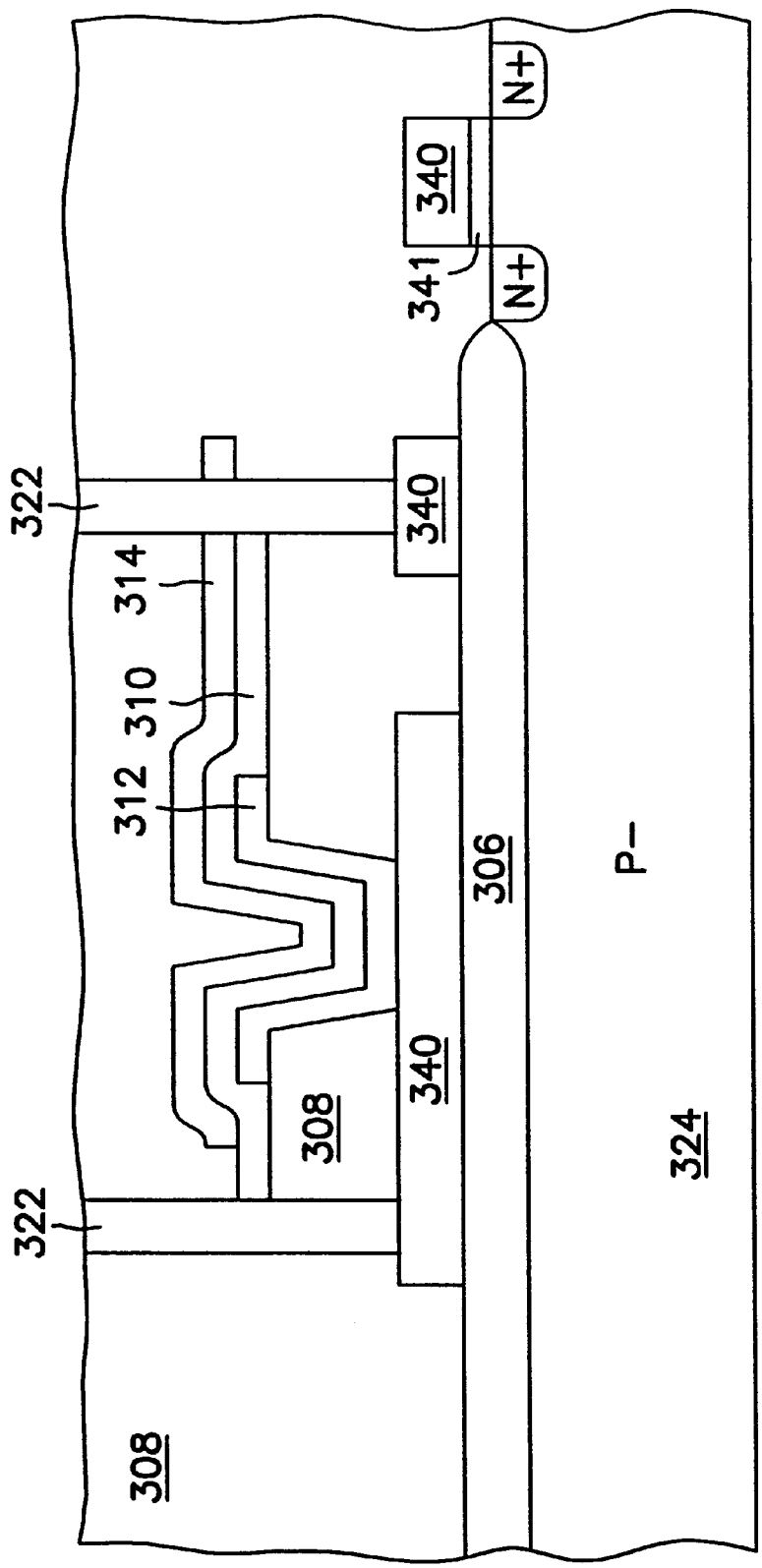

More insulating material 308 is then deposited over the structure, as shown in FIG. 3g. Contact holes 322 are etched and filled with a conducting material, as shown in FIG. 3h, and well known to one skilled in the art. The contact holes 322 are etched down to the polysilicon layer 340. Contacts 322 do not need to be formed in n(+) regions 120 to prevent shorting to the substrate 324, as in prior art antifuses shown in FIG. 1, because they are formed over the field oxide layer 306. Furthermore, the antifuse does not need to be formed over an n(−) region 126, as in prior art antifuses shown in FIG. 1, because it is also formed over the field oxide layer 306. Thus, a junctionless antifuse is formed, which does not have a reverse bias junction breakdown voltage and is not susceptible to junction-to-junction leakage as in prior art antifuses.

Figure 2:
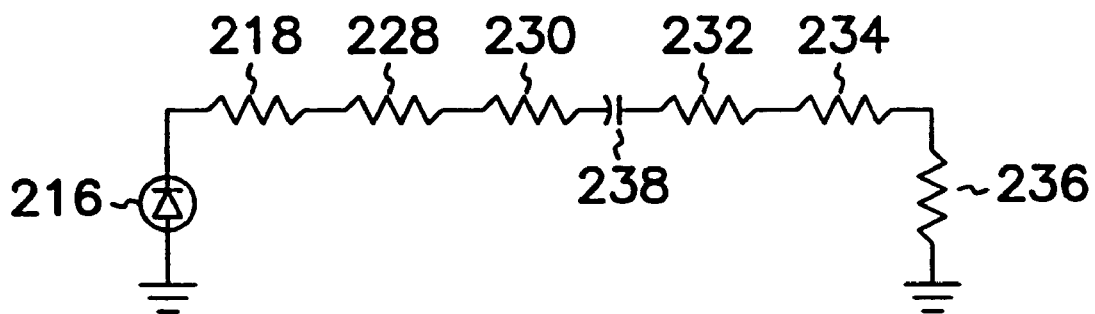
FIG. 2 is a prior art schematic circuit diagram of the unprogrammed antifuse shown in FIG. 1.
Figure 5A:
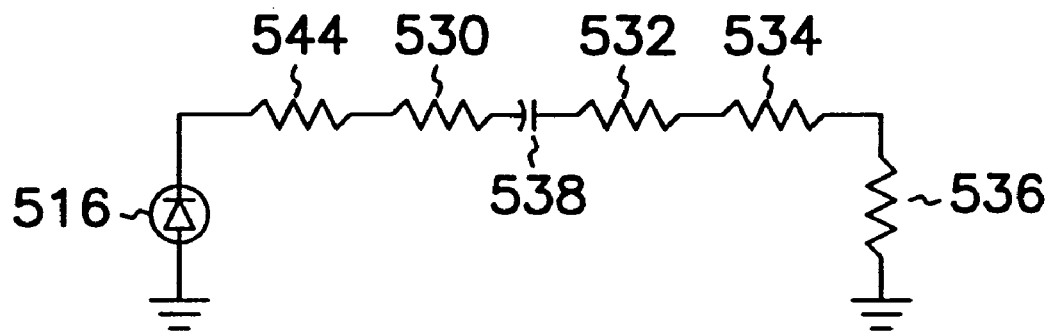
FIG. 5a is a schematic circuit diagram of the unprogrammed antifuse shown in FIG. 3h.

The resistance path to blow the antifuse is much lower due to the elimination of the resistance 228, as shown in prior art FIG. 2, from the n(−) active region. Instead, the n(+) contact resistance 218 and the n(−) active region resistance 228 are replaced by resistance 544, as shown in FIG. 5a, from the polysilicon layer 340 formed over the field oxide layer 306 and shown in FIG. 3h. This enables the antifuse to be programmed at a faster rate because a voltage can be applied across the antifuse, having a magnitude greater than a typical reverse bias breakdown voltage between the n(−)/n(+) regions and the p(−) substrate 324. Experimental data shows that for a 1 Volt increase in the programming voltage, the programming time can decrease by as much as a factor of 10. The limiting factor for the programming voltage would then be the input pad and any other devices connected to the high voltage programming line. Furthermore, the resulting resistance distribution after programming of the junctionless antifuse is more uniform than in prior art antifuses having junctions, due to the absence of n(+) and n(−) regions.

Figure 4A:
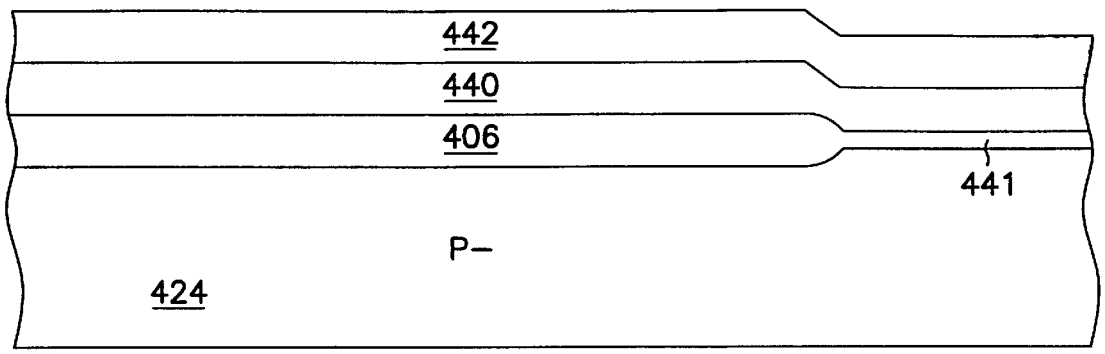
FIGS. 4a–4h are cross-sectional representations of an antifuse formed in accordance with a further method of the invention, where the antifuse is formed over a conducting layer and a refractory metal silicide layer.

In another embodiment, as shown in FIG. 4a, a refractory metal silicide layer 442 is formed on the polysilicon layer 340, shown in FIGS. 3a to 3h, by ways well known to one skilled in the art. A p(−) silicon substrate 424, a small portion of which is shown in FIG. 4a, is patterned with a layer of field oxide 406. Active device regions are defined on the substrate 424 by LOCOS, as well known to one skilled in the art. However, the antifuse can also be formed over field oxide 406, which is coupled to active device regions in the underlying substrate 424. In such a case, the thickness of the field oxide 406 layer is typically approximately 2,500 angstroms. This further conserves valuable semiconductor substrate 424 area. Non-active device regions are meant to include oxidized regions 406, which overlay active device regions in the underlying substrate 424. Thus, device density is improved in a 3-dimensional sense.

In non-active areas of the substrate 424, as shown in FIG. 4a, a polysilicon layer 440 or any other conducting layer is deposited over the field oxide 406. The polysilicon layer 440 is doped to a positive conductivity (p-type) or a negative conductivity (n-type). This can be the same layer of polysilicon 440 as is used in forming transistor gates over gate oxide 441 in active areas of the substrate 424. Thus, the invention does not require any additional pattering steps, masks, or films to manufacture the antifuse. Furthermore, by forming the antifuse over non-active device regions, valuable semiconductor substrate 424 is conserved, allowing ICs to be manufactured with a high device density.

Figure 4B:
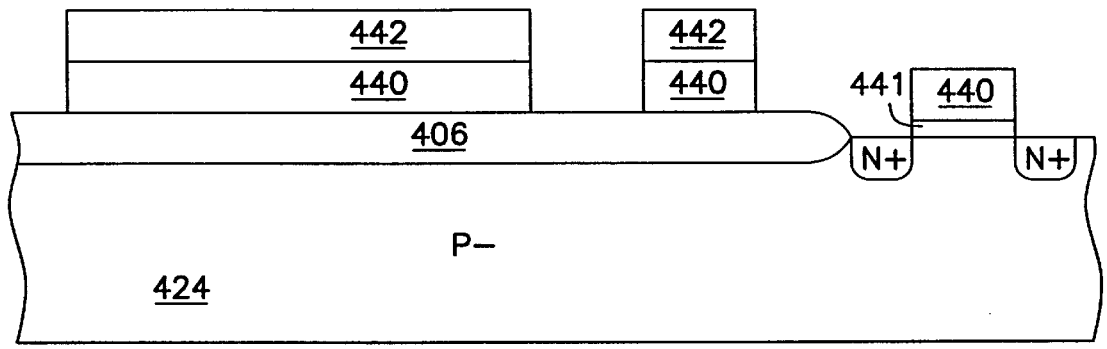

Next, a refractory metal silicide layer 442 is formed on the polysilicon layer 440 by ways well known to one skilled in the art and shown in FIG. 4a. This can be the same layer, as is used elsewhere in the IC, such as on transistor gates and source/drain regions. The polysilicon layer 340 and the silicide layer 442 are then patterned down to the field oxide 406 to define islands, as shown in FIG. 4b, on which antifuses and contacts are formed.

Figure 4C:
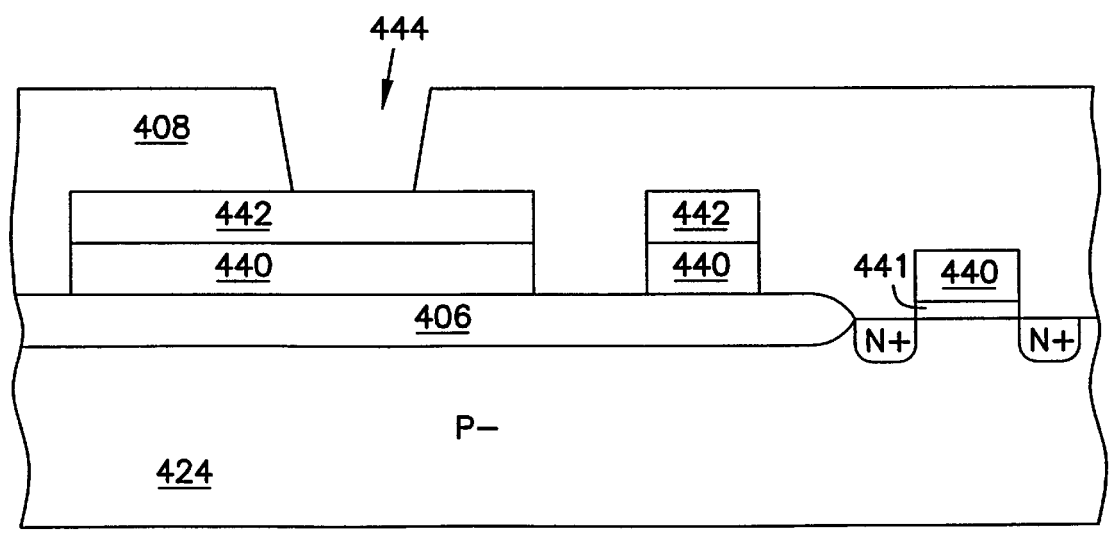
Figure 4D:
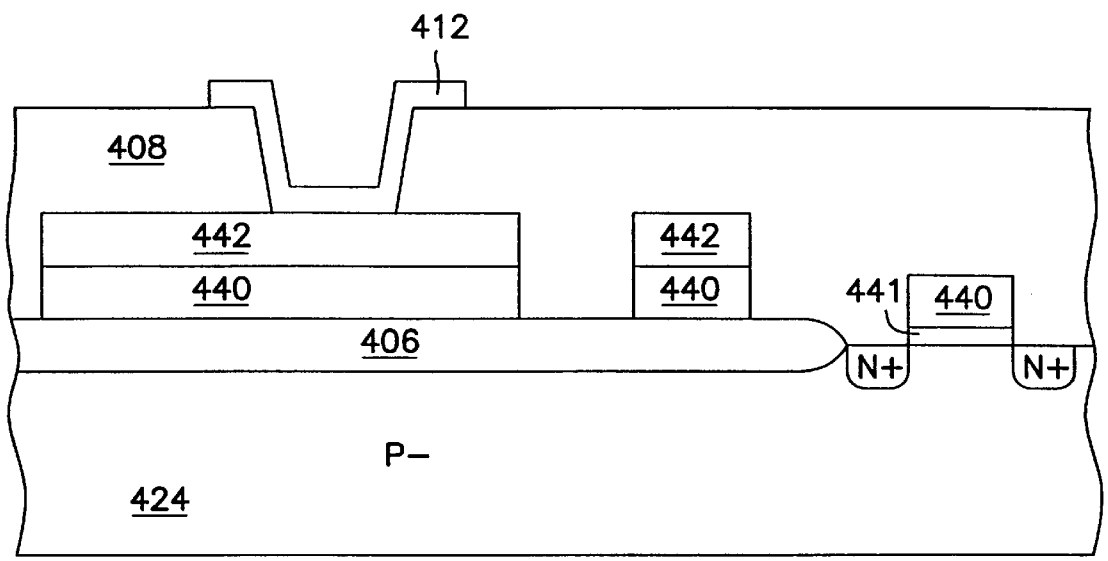

An insulating material 408 is then formed over the structure, and photolithographically masked and etched to define a recess 444 in which an antifuse is subsequently formed, as shown in FIG. 4c. A bottom conductor layer 412 is then formed on the structure, in the recess, as shown in FIG. 4d, defined by a photolithographic mask and etch, or other patterning technique. The bottom conductor layer 412 comprises polysilicon or metal, as well known to one skilled in the art.

Figure 4E:
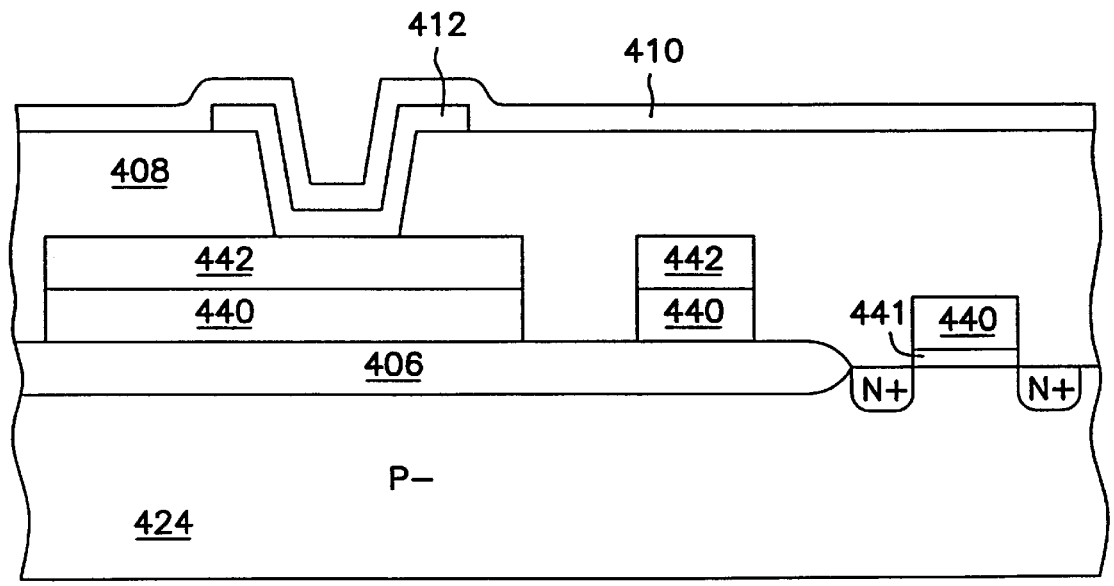

The next process step is forming a programming layer 410 over the bottom conductor layer 412, as shown in FIG. 4e. The programming layer 410 material is selected from the group comprising: amorphous silicon, polysilicon, silicon dioxide, silicon nitride, tantalum oxide, dielectrics, and other programming layer 410 materials well known to one skilled in the art. Furthermore, the programming layer 410 can comprise a combination of layers, including a diffusion barrier layer.

Figure 4F:
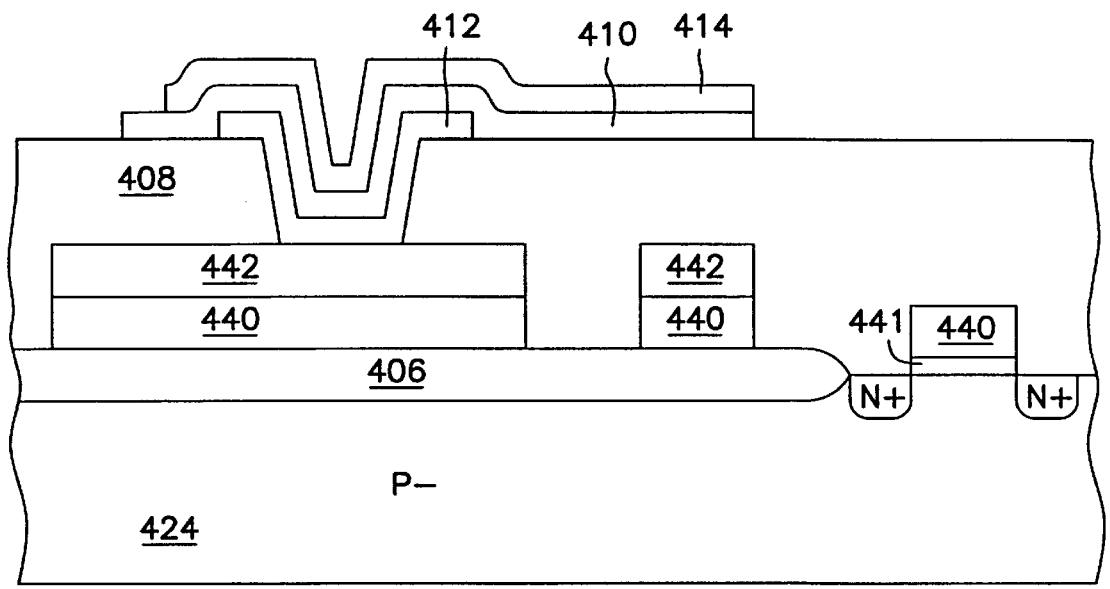

A top conductor layer 414 is then formed on the structure, as shown in FIG. 4f. The top conductor layer 414 and the programming layer 410 are then defined by a photolithographic mask and etch, as shown in FIG. 4f. The top conductor layer 414 comprises polysilicon or metal, as well known to one skilled in the art.

Figure 4G:
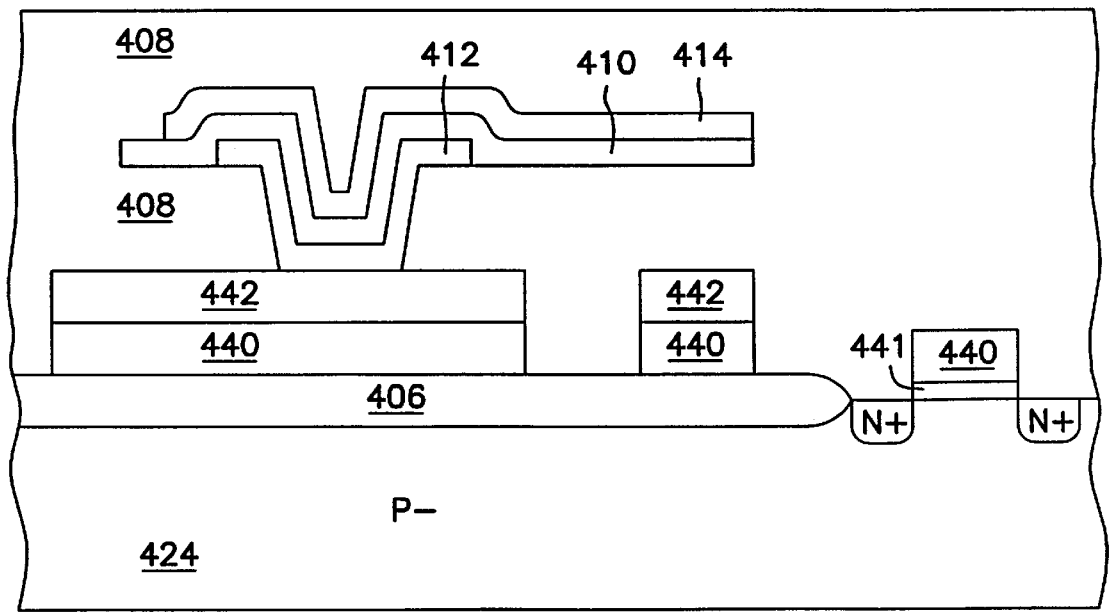
Figure 4H:
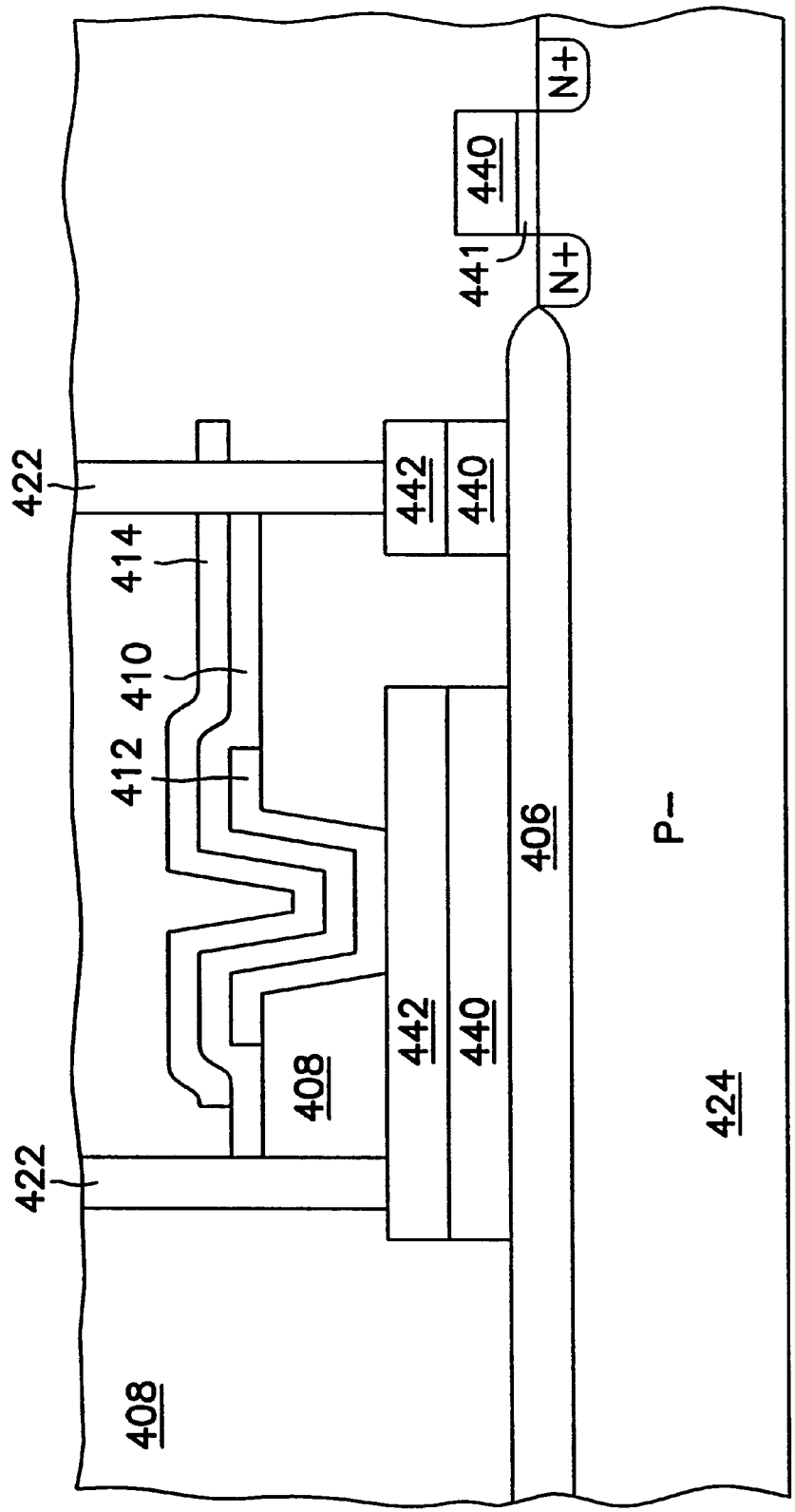

More insulating material 408 is then deposited over the structure, as shown in FIG. 4g. Contact holes 422 are etched and filled with a conducting metal, as shown in FIG. 4h, and well known to one skilled in the art. The contact holes 422 are etched down to the refractory metal silicide layer 442. Contacts 422 do not need to be formed in n(+) regions 120 to prevent shorting to the substrate 424, as in prior art antifuses shown in FIG. 1, because they are formed over the field oxide layer 406. Furthermore, the antifuse does not need to be formed over an n(−) region 126, as in prior art antifuses shown in FIG. 1, because it is also formed over the field oxide layer 406. Thus, a junctionless antifuse is formed, which does not have a reverse bias junction breakdown voltage and is not susceptible to junction-to-junction leakage as in prior art antifuses.

Figure 5B:
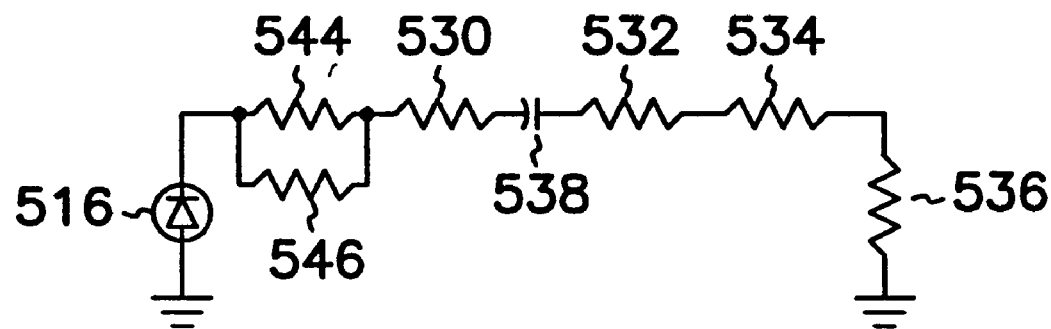
FIG. 5b is a schematic circuit diagram of the unprogrammed antifuse shown in FIG. 4h.

The resistance path to blow the antifuse is much lower due to the elimination of the resistance 228 from the n(−) active region, as shown in prior art FIG. 2. Instead, the n(+) contact resistance 218 and the n(−) active region resistance 228 are replaced by resistance 544, as shown in FIG. 5b, from the polysilicon layer 440, as shown in FIG. 4h, in parallel with resistance 546 from the refinery metal silicide layer 442. This enables the antifuse to be programmed at a faster rate because a programming voltage can be applied across the antifuse, having a magnitude greater than a typical reverse bias breakdown voltage between the n(−)/n(+) regions and the p(−) substrate 424. Furthermore, the resulting resistance distribution after programming of the junctionless antifuse is more uniform than in prior art antifuses having junctions, due to the absence of n(+) and n(−) regions.

It is important that the blown state antifuse resistance be as low as possible, so as not to decrease the speed of an IC and its associated devices. Due to the lower sheet resistance of refractory metal silicide, the silicided antifuse may further lower the resistance through the conductive filament once the antifuse is programmed. The blown state antifuse resistance, as shown in FIGS. 5a and 5b, also includes components well known to one skilled in the art in addition to the resistance components 544 and 546 from the polysilicon and silicide layers respectively, on which the antifuse is formed. These other components include: bottom conductor layer resistance 530, top conductor layer resistance 532, contact resistance 534 and activating transistor resistance 536. The high resistance antifuse capacitance 538 is replaced by an antifuse programmed layer resistance once the antifuse is programmed to an blown state. It must also be taken into account in the overall antifuse resistance. The resulting antifuse structure, formed in accordance with the invention, has a much lower overall resistance due to the absence of an n(−) active region, coupled to the antifuse. This lower resistance enables IC devices, in which conductive paths comprise antifuses programmed in the blown state, to perform more functions at a faster rate. This is critical to meet the demands for denser, faster ICs.

Figure 6A:
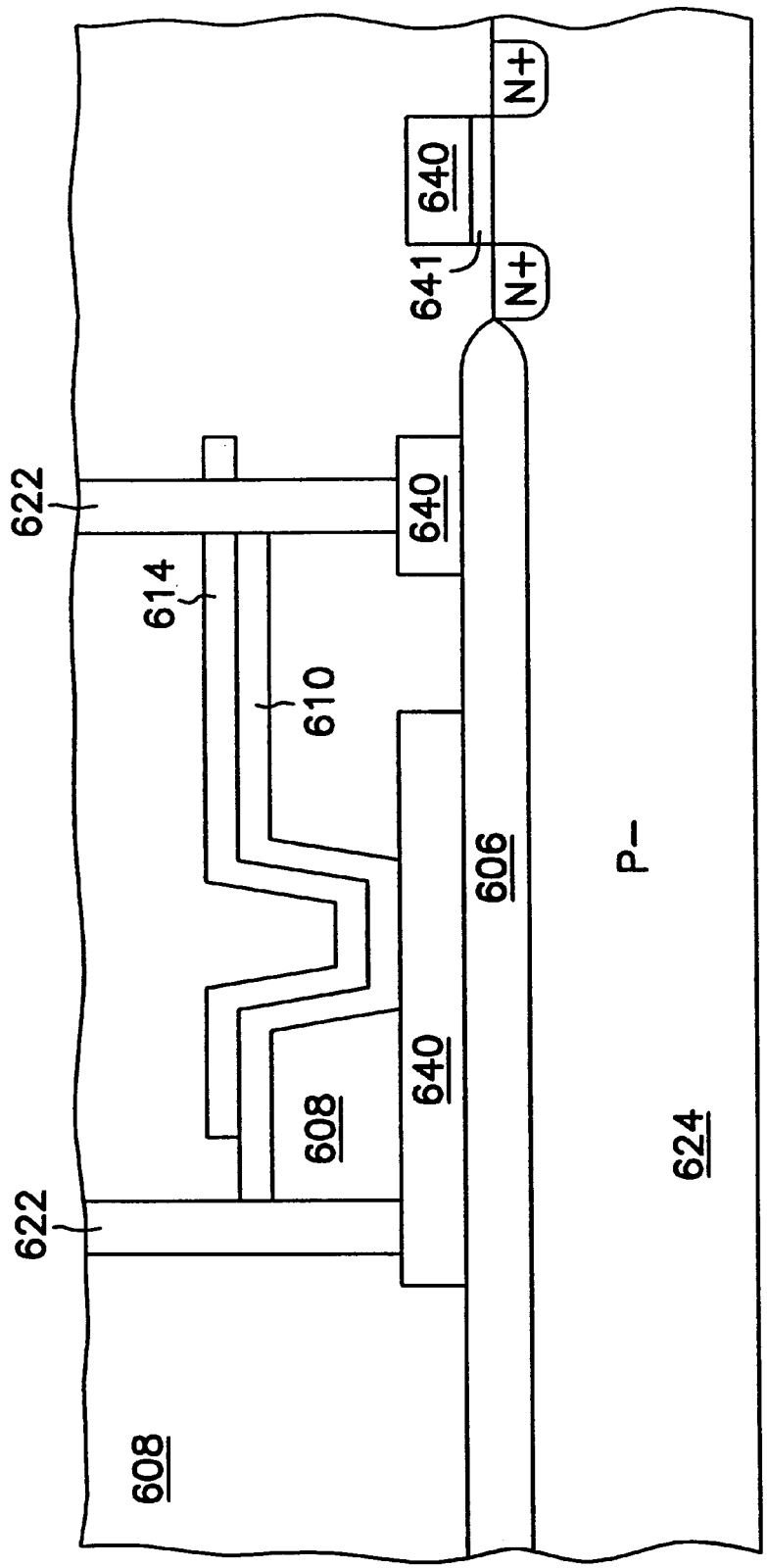
FIG. 6a is an antifuse formed in accordance with a further embodiment of the invention, where the conducting layer comprises a bottom conductor layer in an antifuse.
Figure 6B:
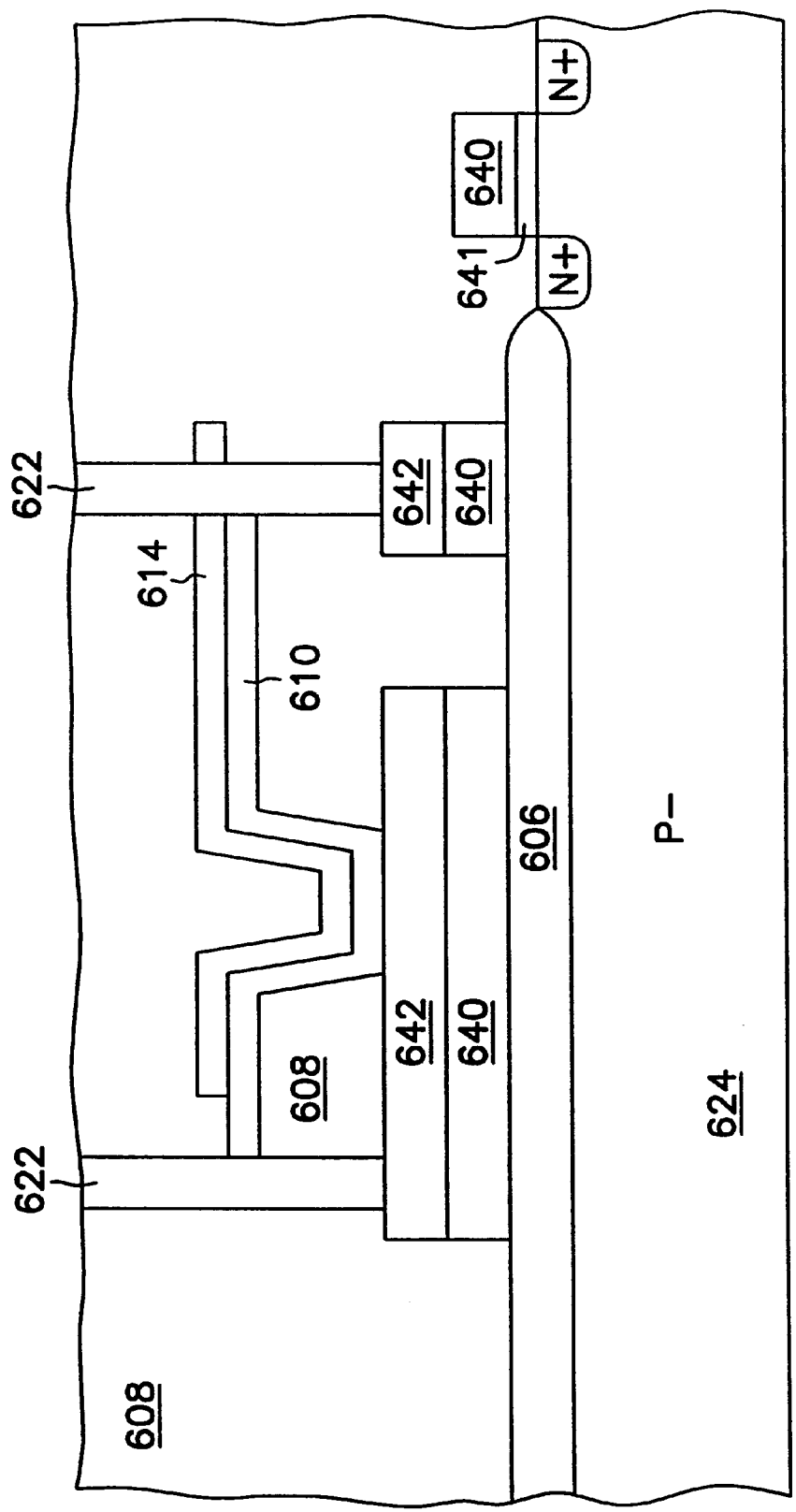
FIG. 6b is an antifuse formed in accordance with a further embodiment of the invention, where the refractory metal silicide layer comprises the bottom conductor layer in an antifuse.

In further embodiments of the invention, as shown in FIGS. 6a and 6b, the polysilicon (conducting layer) 640 or refractory metal silicide layer 642, over which an antifuse is formed, comprises a bottom conductor layer 312, 412 in an antifuse structure, instead of a separate layer, as shown in FIGS. 3h and 4h, respectively. This further decreases the resistance of the antifuse in the blown state.

In one further embodiment, the polysilicon layer 640, as shown in FIG. 6a, comprises the bottom conductor layer of an antifuse. A p(−) silicon substrate 624, a small portion of which is shown in FIG. 6a, is patterned with a layer of field oxide 606. Active device regions are defined on the substrate 624 by LOCOS, as well known to one skilled in the art. However, the antifuse can also be formed over field oxide, which is coupled to active device regions in the underlying substrate 624. This further conserves valuable semiconductor substrate 624 area. Non-active device regions are meant to include oxidized regions 606, which overlay active device regions in the underlying substrate 624. Thus, device density is improved in a 3-dimensional sense.

In non-active areas of the substrate 624, as shown in FIG. 6a, a polysilicon layer 640 or any other conducting layer is deposited over the field oxide 606. The polysilicon layer 640 is doped to a positive conductivity (p-type) or a negative conductivity (n-type). This can be the same layer of polysilicon 640 as is used in forming transistor gates over gate oxide 641 in active areas of the substrate 624. Thus, the invention does not require any additional patterning steps, masks, or films to manufacture the antifuse. Furthermore, by forming the antifuse over non-active device regions, valuable semiconductor substrate 624 is conserved, allowing ICs to be manufactured with a high device density.

The polysilicon layer 640 is then patterned down to the field oxide 606 to define islands, as shown in FIG. 6a, on which further antifuse layers and contacts are formed. An insulating material 608 is then formed over the structure, and photolithographically masked and etched to define a recess 644 in which the further layers of the antifuse are subsequently formed. In this embodiment, the polysilicon layer 640 replaces the separate bottom conductor layer 312, as shown in FIG. 3h for a previously described embodiment.

The next process step is forming a programming layer 610 over the bottom conductor layer 612, as shown in FIG. 6a. The programming layer 610 material is selected from the group comprising: amorphous silicon, polysilicon, silicon dioxide, silicon nitride, tantalum oxide, dielectrics, and other programming layer 610 materials well known to one skilled in the art. Furthermore, the programming layer 610 can comprise a combination of layers, including a diffusion barrier layer.

A top conductor layer 614 is then formed on the structure, as shown in FIG. 6a. The programming layer 610 and then top conductor layer 614 are then defined by a photolithographic mask and etch. The top conductor layer 614 comprises polysilicon or metal, as well known to one skilled in the art.

More insulating material 608 is then deposited over the structure, as shown in FIG. 6a. Contact holes 622 are etched and filled with a conducting metal, as well known to one skilled in the art. The contact holes 622 are etched down to the polysilicon layer 640. Contacts 622 do not need to be formed in n(+) regions 120 to prevent shorting to the substrate 624, as in prior art antifuses shown in FIG. 1, because they are formed over the field oxide layer 606. Furthermore, the antifuse does not need to be formed over an n(−) region 126, as in prior art antifuses shown in FIG. 1, because it is also formed over the field oxide layer 606. Thus, a junctionless antifuse is formed, which does not have a reverse bias junction breakdown voltage and is not susceptible to junction-to-junction leakage as in prior art antifuses.

Figure 5C:
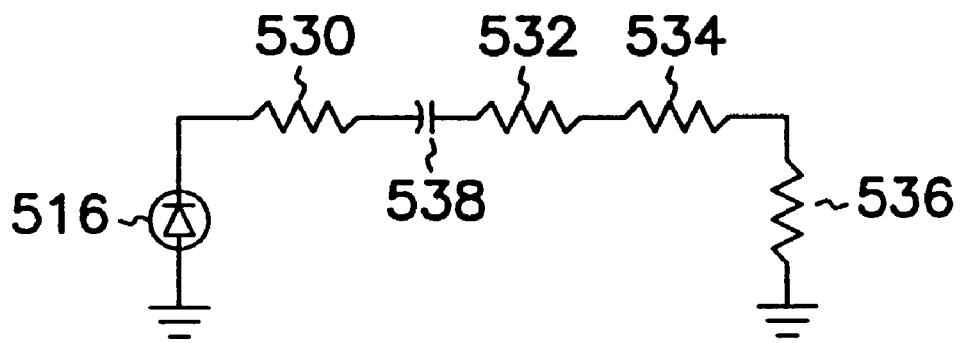

When a polysilicon layer 640 comprises the bottom conductor layer, the total resistance of the system, as shown in FIG. 5c, is decreased by the resistance of a separate polysilicon layer 544, as shown in FIG. 5a and utilized in the first embodiment of the invention. This is highly advantageous to providing an antifuse having a low resistance in the blown slate.

In a second further embodiment, the refractory metal silicide layer 642, as shown in FIG. 6b, comprises the bottom conductor layer of an antifuse. A p(−) silicon substrate 624, a small portion of which is shown in FIG. 6b, is patterned with a layer of field oxide 606. Active device regions are defined on the substrate 624 by LOCOS, as well known to one skilled in the art. However, the antifuse can also be formed over field oxide, which is coupled to active device regions in the underlying substrate 624. This ether conserves valuable semiconductor substrate 624 area. Nonactive device regions are meant to include oxidized regions 606, which overlay active device regions in the underlying substrate 624. Thus, device density is improved in a 3-dimensional sense.

In non-active areas of the substrate 624, as shown in FIG. 6b, a polysilicon layer 640 or any other conducting layer is deposited over the field oxide 606. The polysilicon layer 640 is doped to a positive conductivity (p-type) or a negative conductivity (n-type). This can be the same layer of polysilicon 640 as is used in forming transistor gates over gate oxide 641 in active areas of the substrate 624. Thus, the invention does not require any additional patterning steps, masks, or films to manufacture the antifuse. Furthermore, by forming the antifuse over non-active device regions, valuable semiconductor substrate 624 is conserved, allowing ICs to be manufactured with a high device density.

Next, a refractory metal silicide layer 642, as shown in FIG. 6b, is formed on the polysilicon layer 640 by ways well known to one skilled in the art. This can be the same layer, as is used elsewhere in the IC, such as on transistor gates and source/drain regions. The polysilicon layer 640 and the silicide layer 642 are then patterned down to the field oxide 606 to define islands on which further antifuse layers and contacts are formed. An insulating material 608 is then formed over the structure, and photolithographically masked and etched to define a recess 644 in which the further layers of the antifuse are subsequently formed. In this embodiment, the refractory metal silicide layer 642 replaces the separate bottom conductor layer 412, as shown in FIG. 4h for a previously described embodiment.

The next process step is forming a programing layer 610, as shown in FIG. 6b, over the bottom conductor layer 612. The programming layer 610 material is selected from the group comprising: amorphous silicon, polysilicon, silicon dioxide, silicon nitride, tantalum oxide, dielectrics, and other programming layer 610 materials well known to one skilled in the art. Furthermore, the programming layer 610 can comprise a combination of layers, including a diffusion barrier layer.

A top conductor layer 614 is then formed on the structure, as shown in FIG. 6b. The top conductor layer 614 and the programming layer 610 are then defined by a photolithographic mask and etch. The top conductor layer 614 comprises polysilicon or metal, as well known to one skilled in the art.

More insulating material 608 is then deposited over the structure, as shown in FIG. 6b. Contact holes 622 are etched and filled with a conducting material, as well known to one skilled in the art. The contact holes 622 are etched down to the refractory metal silicide layer 642. Contacts 622 do not need to be formed in n(+) regions 120 to prevent shorting to the substrate 624, as in prior art antifuse shown in FIG. 1, because they are formed over the field oxide layer 606. Furthermore, the antifuse does not need to be formed over an n(−) region 126, as in prior art antifuses shown in FIG. 1, because it is also formed over the field oxide layer 606. Thus, a junctionless antifuse is formed, which does not have a reverse bias junction breakdown voltage and is not susceptible to junction-to-junction leakage as in prior art antifuses.

Figure 5D:
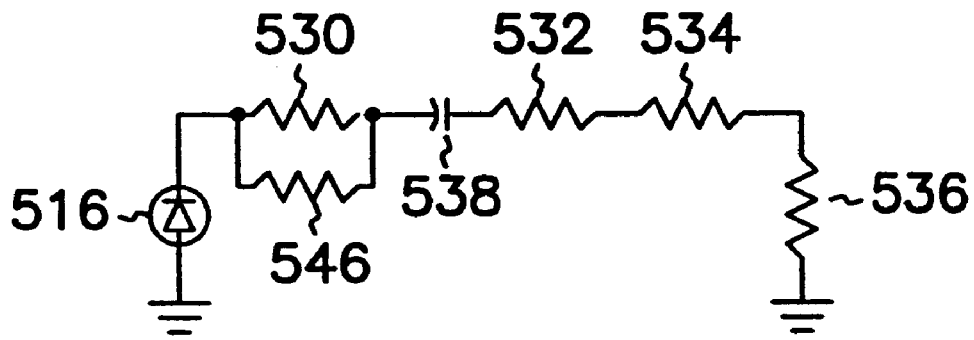
FIG. 5d is a schematic circuit diagram of an unprogrammed antifuse shown in FIG. 6b.

When a refractory metal silicide layer 642, as shown in FIG. 6b, comprises the bottom conductor layer, the total resistance of the system, as shown in FIG. 5d, is altered to move the bottom conductor layer resistance 530 in parallel with the resistance from the refractory metal silicide 546, as shown in FIG. 5b and utilized in the second embodiment of the invention. The separate polysilicon layer resistance 544, previously in parallel with resistance from the refractory metal silicide layer 546, is removed from the total resistance of the antifuse structure. This is highly advantageous to providing an antifuse having a low resistance in the blown state.

It should be noted that in CMOS technology, many times certain areas of the semiconductor die described as having a particular doping, could quite easily be of a different doping, promoting a different type of charge carrier. In such instances, if one were to reverse the primary carriers in all areas of the die and adjust for carrier mobility, the invention would operate in the same manner as described herein without departing from the scope and spirit of the present invention. Furthermore, photolithogaphic mask and etch steps were described as used to define certain structures. Other well known patterning techniques are also suitable for forming such structures.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A method for selectively forming an antifuse in an integrated circuit, comprising:
    forming a first conducting layer on an insulator, which is supported by a semiconductor substrate;
    patterning the first conducting layer to form a first conductive island of the antifuse and a second conductive island of the antifuse;
    forming a bottom conductor layer on the first conductive island;
    forming a programming layer on the bottom conductor layer; and
    forming a top conductor layer on the programming layer overlying at least a portion of the second conductive island.

2. The method of claim 1, and further comprising forming a first contact to the first conductive island and forming a second contact through the top conductor layer to the second conductive island.

3. The method of claim 1, and further comprising forming a refractory metal silicide layer on the first conductive island, prior to forming the bottom conductor layer.

4. The method of claim 3, and further comprising forming a first contact to the refractory metal silicide layer and forming a second contact through the top conductor layer to the second conductive island.

5. The method of claim 1, and further comprising applying a programming voltage to significantly reduce the electrical resistance between the top and bottom conductor layers.

6. The method of claim 1, wherein forming the first conducting layer simultaneously forms transistor gates in selected areas of the integrated circuit.

7. The method of claim 1, wherein the bottom and top conductor layers comprise a material selected from the group consisting of polysilicon and metals.

8. The method of claim 1, wherein the programming layer is selected from the group consisting of amorphous silicon, polysilicon, silicon dioxide, silicon nitride, tantalum oxide and dielectric materials.

9. A method for selectively forming an antifuse in an integrated circuit, comprising:
    forming a first conducting layer on an insulator, which is supported by a semiconductor substrate;
    patterning the first conducting layer to form a first conductive island of the antifuse and a second conductive island of the antifuse;
    forming a bottom conductor layer on the first conductive island;
    forming a programming layer on the bottom conductor layer;
    forming a top conductor layer on the programming layer overlying at least a portion of the second conductive island;
    forming a first contact to the first conductive island; and
    forming a second contact through the top conductor layer to the second conductive island.

10. A method for selectively forming an antifuse in an integrated circuit, comprising:
    forming a first conducting layer on an insulator, which is supported by a semiconductor substrate;
    patterning the first conducting layer to form a first conductive island of the antifuse and a second conductive island of the antifuse;
    forming a refractory metal silicide layer on the first conductive island;
    forming a bottom conductor layer on the refractory metal silicide layer;
    forming a programming layer on the bottom conductor layer; and
    forming a top conductor layer on the programming layer overlying at least a portion of the second conductive island.

11. A method for selectively forming an antifuse in an integrated circuit, comprising:
    forming a first conducting layer on an insulator, which is supported by a semiconductor substrate;
    patterning the first conducting layer to form a first conductive island of the antifuse and a second conductive island of the antifuse;
    forming a refractory metal silicide layer on the first conductive island;
    forming a bottom conductor layer on the refractory metal silicide layer;
    forming a programming layer on the bottom conductor layer;
    forming a top conductor layer on the programming layer overlying at least a portion of the second conductive island;
    forming a first contact to the refractory metal silicide layer; and
    forming a second contact through the top conductor layer to the second conductive island.

12. A method for selectively forming an antifuse in an integrated circuit, comprising:
    forming a first conducting layer on an insulator, which is supported by a semiconductor substrate;
    patterning the first conducting layer to form a first conductive island of the antifuse and a second conductive island of the antifuse;
    forming a bottom conductor layer on the first conductive island, wherein the bottom conductor layer comprises a material selected from the group consisting of polysilicon and metals;
    forming a programming layer on the bottom conductor layer, wherein the programming layer comprises a material selected from the group consisting of amorphous silicon, polysilicon, silicon dioxide, silicon nitride, tantalum oxide and dielectric materials; and
    forming a top conductor layer on the programming layer overlying at least a portion of the second conductive island, wherein the top conductor layer comprises a material selected from the group consisting of polysilicon and metals.

13. A method for selectively forming an antifuse in an integrated circuit, comprising:
    forming a first conducting layer on an insulator, which is supported by a semiconductor substrate;
    patterning the first conducting layer to form a first conductive island of the antifuse and a second conductive island of the antifuse;
    forming a refractory metal silicide layer on the first conductive island;
    forming a bottom conductor layer on the refractory metal silicide layer, wherein the bottom conductor layer comprises a material selected from the group consisting of polysilicon and metals;
    forming a programming layer on the bottom conductor layer, wherein the programming layer comprises a material selected from the group consisting of amorphous silicon, polysilicon, silicon dioxide, silicon nitride, tantalum oxide and dielectric materials; and forming a top conductor layer on the programming layer overlying at least a portion of the second conductive island, wherein the top conductor layer comprises a material selected from the group consisting of polysilicon and metals.

* * * * *